United States Patent
Yamamoto

(10) Patent No.: US 6,566,953 B2
(45) Date of Patent: May 20, 2003

(54) HIGH-FREQUENCY AMPLIFIER CIRCUIT FOR UHF TELEVISION TUNER HAVING LESS DISTORTION

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/011,174

(22) Filed: Dec. 5, 2001

(65) Prior Publication Data

US 2002/0070807 A1 Jun. 13, 2002

(30) Foreign Application Priority Data

Dec. 7, 2000 (JP) ......................................... 2000-377996

(51) Int. Cl.[7] ................................................ H03F 3/16
(52) U.S. Cl. ...................... 330/277; 330/302; 330/305; 331/117; 455/118.2; 455/183.1; 455/196.1; 334/15
(58) Field of Search ................................. 330/277, 302, 330/305; 455/196.1, 191.2, 118.2, 183.1; 331/117; 334/15

(56) References Cited

U.S. PATENT DOCUMENTS

| | | | | |
|---|---|---|---|---|
| 4,048,598 A | * | 9/1977 | Knight | 334/15 |
| 4,091,419 A | * | 5/1978 | Rhee et al. | 348/673 |
| 4,442,548 A | * | 4/1984 | Lehmann | 455/196.1 |
| 4,590,613 A | * | 5/1986 | Tannery, IV | 455/200.1 |
| 4,703,286 A | * | 10/1987 | Muterspaugh | 331/117 FE |
| 5,576,662 A | | 11/1996 | Price et al. | 330/277 |

FOREIGN PATENT DOCUMENTS

JP  2001-156567  6/2001

* cited by examiner

Primary Examiner—Michael Tokar
Assistant Examiner—Linh V Nguyen
(74) Attorney, Agent, or Firm—Brinks Hofer Gilson & Lione

(57) ABSTRACT

A high-frequency amplifier circuit for a UHF television tuner includes an FET having a first gate for inputting a UHF band television signal and a second gate for applying an AGC voltage which varies the gain. The second gate is grounded via a series circuit including a resistor and a DC-cutting capacitor. The impedance of the DC-cutting capacitor is sufficiently lower than the resistance of the resistor in the UHF band.

1 Claim, 3 Drawing Sheets

HIGH-FREQUENCY AMPLIFIER CIRCUIT FOR UHF TELEVISION TUNER HAVING LESS DISTORTION

BACKGROUND OF THE INVENTION

1. Field of the Invention

The present invention relates to high-frequency amplifier circuits for UHF television tuners.

2. Description of the Related Art

Hereinafter, a known art is described with reference to FIGS. 3, 6, and 7. FIG. 6 shows a known high-frequency amplifier circuit for a UHF television tuner (hereinafter referred to as a high-frequency amplifier circuit). UHF band television signals are input via an input tuning circuit 21 to a first gate G1 of a dual gate FET 22. Connected to the first gate G1 is a peaking coil 23 for compensating gain reduction of a low UHF band, and a bias voltage is applied from a power supply B to the first gate G1 via the peaking coil 23. An AGC voltage A for varying the gain of the FET 22 is applied to a second gate G2 via a feed resistor 24. The second gate G2 is grounded in a high-frequency state via a grounding capacitor 25, which has a capacitance of several nF. A source S is also grounded in a high-frequency state.

The amplified UHF band television signals are output from a drain D and input to an interstage tuning circuit 26. Then, UHF band television signals to be received are selected there and the selected signals are input to a mixer (not shown) in the next stage.

FIG. 7 shows a circuit diagram in which the FET 22 is equivalently represented with two single-gate FETs each having a grounded source or a grounded gate. Herein, it is difficult to securely ground the second gate G2 in a high-frequency state due to the residual inductance of the grounding capacitor 25 and the inductance of a wiring conductor for connecting the grounding capacitor 25. Actually, the second gate G2 is grounded via an inductance component L having a low inductance. The impedance of the inductance component L is not negligible in the UHF band, because it generates distortion in an operation of the FET 22 and deteriorates a cross modulation characteristic.

The cross modulation characteristic is defined by a level of a disturbing signal which causes 1% of cross modulation. Accordingly, the higher the level is, the better cross modulation characteristic is. Since the cross modulation occurs in the high-frequency amplifier circuit, a variation in the level to attenuation in the gain of the high-frequency amplifier circuit is measured in general. In FIG. 3, X1 represents a cross modulation characteristic in the known art. The cross modulation characteristic is deteriorated when attenuation in the gain is 25 dB or more, and the level of the disturbing signal is lowered to 96 dBµ at 45 dB, thus easily causing cross modulation. Although the reason for this is not clear, a possible reason is a phase when the FET at the grounded gate is fed back negatively by the inductance component L.

SUMMARY OF THE INVENTION

Accordingly, it is an object of the present invention to provide a high-frequency amplifier circuit for a UHF television tuner, in which a dual gate FET of the circuit reduces distortion generated when a UHF band television signal is amplified.

To this end, according to the present invention, a high-frequency amplifier circuit for a UHF television tuner comprises an FET having a first gate for inputting a UHF band television signal and a second gate for applying an AGC voltage which varies the gain. The second gate is grounded via a series circuit including a resistor and a DC-cutting capacitor. The impedance of the DC-cutting capacitor is sufficiently lower than the resistance of the resistor in the UHF band.

With these features, the FET is fed back by the resistance, and distortion is improved.

Preferably, the resistor is connected to the second gate, the DC-cutting capacitor is grounded, and the AGC voltage is applied to the node between the resistor and the DC-cutting capacitor.

Accordingly, the voltage source impedance of the AGC voltage is not coupled to the second gate and the second gate is grounded securely via only the resistor.

Further, the resistance of the resistor may be in the range of 25 to 100Ω. In such a case, the gain and noise figure are slightly degraded while the cross modulation and distortion of PCS beat are remarkably improved.

DESCRIPTION OF THE PREFERRED EMBODIMENTS

Figure 1:
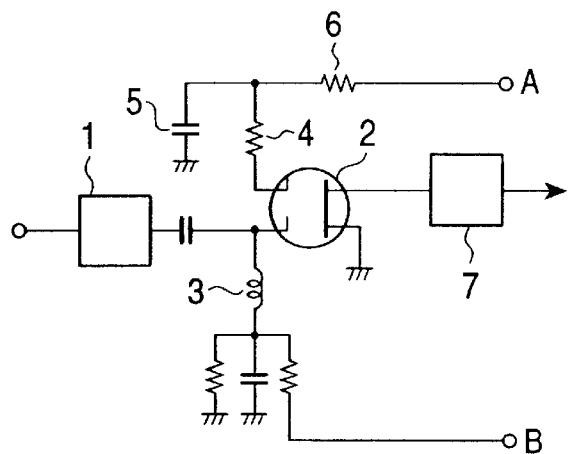
FIG. 1 is a circuit diagram showing a configuration of a high-frequency amplifier circuit for a UHF television tuner of the present invention.

FIG. 1 shows a high-frequency amplifier circuit for a UHF television tuner of the present invention. In FIG. 1, UHF band television signals are input via an input tuning circuit 1 to a first gate G1 of a dual gate FET 2 constituting the high-frequency amplifier circuit. Connected to the first gate G1 is a peaking coil 3 for compensating gain reduction of a low UHF band, and a bias voltage is applied from a power supply B to the first gate G1 via the peaking coil 3. An AGC voltage A for varying the gain of the FET 2 is applied to a second gate G2. The second gate G2 is grounded via a series circuit including a resistor 4 with a resistance of several tens Ω (preferably 25 to 100 Ω) and a DC-cutting capacitor 5, and the AGC voltage is applied to the node between the resistor 4 and the DC-cutting capacitor 5 via a feed resistor 6. Accordingly, the second gate G2 is securely grounded via the resistor 4 in a high-frequency state, regardless of the resistance of the feed resistor 6, which is a power-side impedance of the AGC voltage.

The DC-cutting capacitor 5 grounds the second gate G2 via the resistor 4 and DC-insulates the second gate G2 from the ground, and is set to a capacitance so that the capacitor has an extremely low impedance in the UHF band. Consequently, even if a ripple component is superimposed in the AGC voltage, it is removed by the DC-cutting capacitor 5. Further, the capacitive reactance and the residual inductance are set so that the inductive reactance of the DC-cutting capacitor 5 can be set to an negligible level for a net resistance component of the resistor 4 in the UHF band (preferably about 1/20 or less).

The UHF band television signals amplified at the FET 2 are output from a drain D and are input to an output tuning circuit 7. Then, UHF band television signals to be received are selected there and are input to a mixer (not shown).

Figure 2:
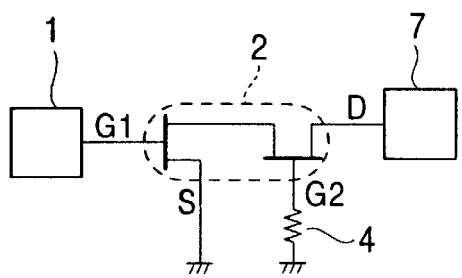
FIG. 2 is an equivalent circuit diagram of the high-frequency amplifier circuit.

FIG. 2 shows an equivalent circuit of the high-frequency amplifier circuit in which the FET 2 is equivalently represented with two single-gate FETs each having a grounded source or a grounded gate. The second gate G2 is grounded in a high-frequency state via the net resistance component of the resistor 4.

Figure 3:
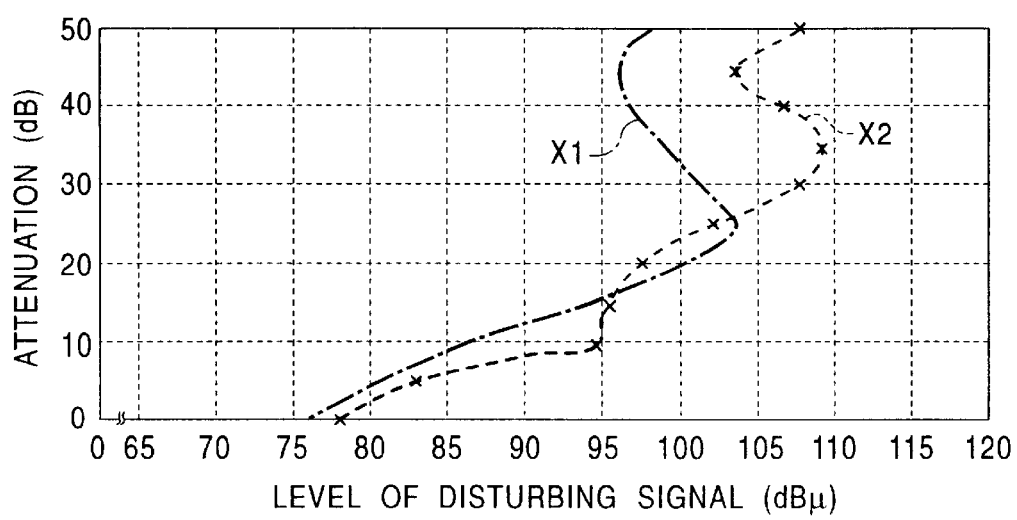
FIG. 3 is a diagram for comparing the cross modulation characteristic to attenuation in the gain in high-frequency amplifier circuits of the present invention and a known art.

In FIG. 3, X2 represents an example of the cross modulation characteristic (channel 69), when the resistance of the resistor 4 connected to the second gate G2 is 75 Ω. The cross modulation is improved if the gain of the FET 2 is attenuated by 25 dB or more, and particularly, an improvement of about 10 dB can be achieved if the gain is attenuated by 35 dB or more. This improvement is believed to be achieved by a negative feedback based on the net resistance.

It is proven that a further improvement in cross modulation can be achieved when the resistance of the resistor 4 is increased, but at the same time, that a gain reduction of the FET 2 and deterioration of noise figure occur.

Figure 4:
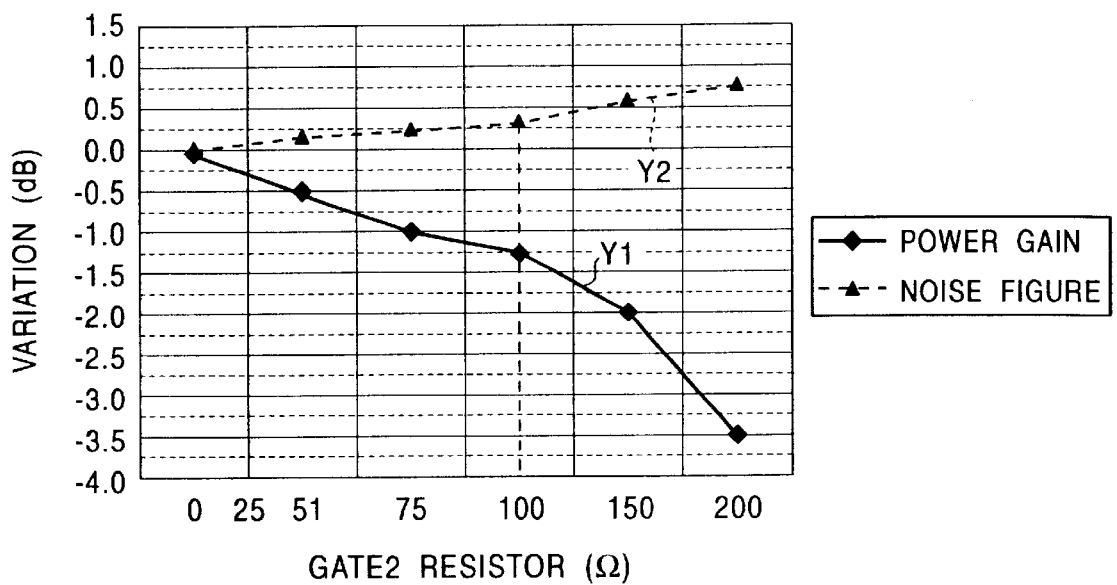
FIG. 4 shows variations in characteristics of gain and noise figure in the high-frequency amplifier circuit.

FIG. 4 shows variations in gain Y1 and noise figure Y2 of the resistance of the resistor 4. As the resistance increases, the gain is reduced and noise figure is degraded. However, the variation is trivial, that is, gain reduction is 1.2 dB or less and the variation in noise figure is within 0.3 dB at the resistance of 100 Ω. The gain is, however, reduced remarkably when the resistance exceeds 100 Ω.

Figure 5:
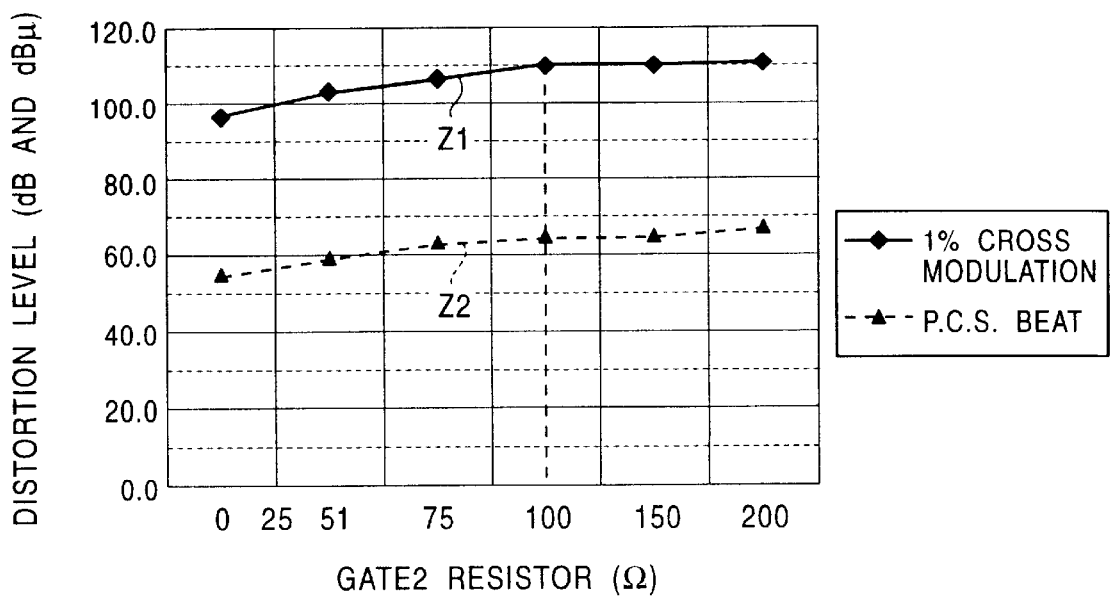
FIG. 5 shows variations in cross modulation characteristic of the high-frequency amplifier circuit.
Figure 6:
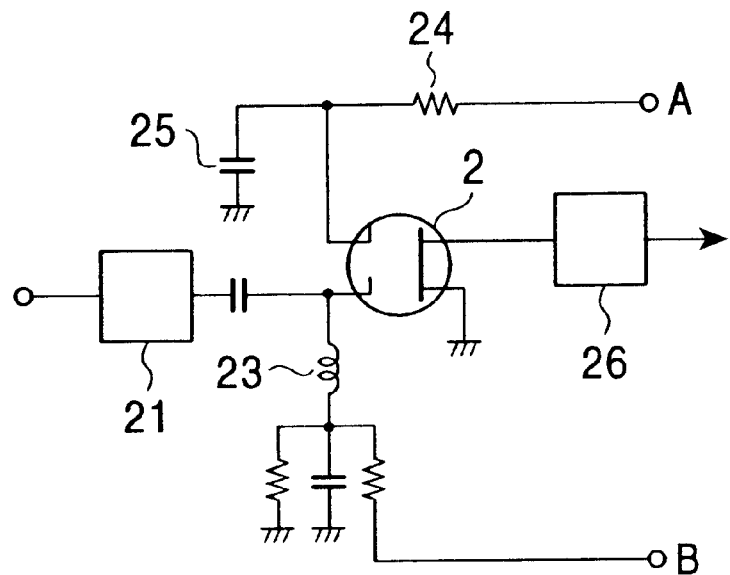
FIG. 6 is a circuit diagram showing a configuration of a known high-frequency amplifier circuit for a UHF television tuner.
Figure 7:
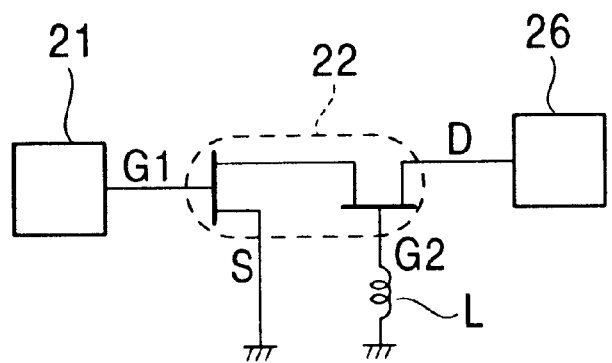
FIG. 7 is an equivalent circuit diagram of the known high-frequency amplifier circuit.

On the other hand, FIG. 5 shows variations in cross modulation Z1 and PCS beat Z2 of the resistance of the resistor 4. The PCS beat is a disturbing signal (beat signal) generated in the band by three signals: a video carrier signal, a sound carrier signal, and a chrominance subcarrier signal. This diagram shows a level difference according to the video carrier signal. Accordingly, it is preferred that the level difference is greater. In addition, the cross modulation and the PCS beat are measured in a state that the gain of the FET is attenuated by 40 dB with the AGC voltage.

As is apparent from FIG. 5, as the resistance of the resistor 4 is increased, the cross modulation and distortion of PCS beat are improved, and the level difference is about 10 dB at 100 Ω.

As described above, the resistance of the resistor 4 varies the above-described characteristics. However, within the range of 25 to 100Ω, the gain and noise figure are slightly degraded while the cross modulation and distortion of PCS beat are remarkably improved.

What is claimed is:

1. A high-frequency amplifier circuit for a UHF television tuner, comprising:

an FET having a first gate for inputting a UHF band television signal and a second gate for applying an AGO voltage which varies the gain, wherein said second gate is grounded via a series circuit including a resistor and a DC-cutting capacitor, between said second gate and ground, said AGO voltage is supplied to a node between said resistor and said DC-cutting capacitor, a resistance of said resistor is set in a range of about 50 Ω to about 100 Ω, and an inductance reactance of said DC-cutting capacitor is less than 1/20 of a resistance of said resistor in the UHF band.

* * * * *

UNITED STATES PATENT AND TRADEMARK OFFICE
CERTIFICATE OF CORRECTION

PATENT NO.    : 6,566,953 B2
DATED         : May 20, 2003
INVENTOR(S)   : Masaki Yamamoto It is certified that error appears in the above-identified patent and that said Letters Patent is hereby corrected as shown below:

Column 4,
Line 5, delete "AGO" and substitute -- AGC -- in its place.
Line 9, delete "AGO" and substitute -- AGC -- in its place.

Signed and Sealed this

Eighteenth Day of November, 2003

JAMES E. ROGAN
*Director of the United States Patent and Trademark Office*